United States Patent [19]

Satoh et al.

[11] Patent Number: 4,706,221
[45] Date of Patent: Nov. 10, 1987

[54] REFRESHING OF DYNAMIC RAM

[75] Inventors: Masaharu Satoh; Sadakatsu Hashimoto, both of Nara, Japan

[73] Assignee: Sharp Kabushiki Kaisha, Osaka, Japan

[21] Appl. No.: 480,374

[22] Filed: Mar. 30, 1983

[30] Foreign Application Priority Data

Jan. 31, 1983 [JP] Japan .................................. 58-15744

[51] Int. Cl.[4] .............................................. G11C 13/00
[52] U.S. Cl. ........................................ 365/222; 364/900
[58] Field of Search ... 364/200 MS File, 900 MS File; 365/222

[56] References Cited

U.S. PATENT DOCUMENTS

| | | | |
|---|---|---|---|
| 4,158,883 | 6/1979 | Kadono et al. | 365/222 |
| 4,172,282 | 10/1979 | Richelmann | 365/222 |
| 4,185,323 | 1/1980 | Johnson et al. | 365/222 |
| 4,249,247 | 2/1981 | Patel | 365/222 |
| 4,317,169 | 2/1982 | Panepinto, Jr. et al. | 364/200 |
| 4,357,686 | 11/1982 | Scheuneman | 365/222 |

Primary Examiner—Gary V. Harkcom
Assistant Examiner—Randy W. Lacasse
Attorney, Agent, or Firm—Birch, Stewart, Kolasch & Birch

[57] ABSTRACT

A new method of refreshing a dynamic RAM, uses relatively simple circuitry. Refreshing of the dynamic RAM can be implemented while smoothly accessing any a real-time based high-speed devices such as a floppy disc driver.

In a microprocessor system comprising a central processing unit (CPU), a dynamic RAM, and a plurality of input/output ports, a refreshing process of the dynamic RAM can occur in one of two modes. When input/output (I/O) accesses are not being performed by the CPU, a burst mode refreshing process takes place. However, when input/output (I/O) accesses are to be performed, a refreshing process of the dynamic RAM can be implemented within a period while the CPU accesses the input/output (I/O) port addresses.

4 Claims, 5 Drawing Figures

REFRESHING OF DYNAMIC RAM

BACKGROUND OF THE INVENTION

The present invention relates to a method of refreshing a dynamic RAM (Random Access Memory) used by any personal computer, more particularly to a new method of refreshing a dynamic RAM so that the desired refreshing of a dynamic RAM can be executed by means of relatively simple circuitry, and therefore any of the high-speed devices using the real-time means such as a floppy disc driver unit can easily be accessed.

The semi-conductor manufacturing technology has achieved an overall development in recent years. This modern technology has successfully brought a variety of ICs into the field of the computer memory means. The problem of trading cost economy for further improvement of memory density potentials has been solved by now, and as a result, a large quantity of low-cost ICs, having greater capacities, have been delivered to the industrial markets, including ROM, static RAM, dynamic RAM, and others. Of these, compared to the static RAM, the dynamic RAM must be periodically subject to a refreshing process in order to properly store a variety of data in memory. Usually, such a periodic refreshing process must be executed at intervals of every 2 microseconds. In terms of the operational speed, such a dynamic RAM is rather disadvantageous when compared to other memories having identical access time such as the static RAM. This is because a short period of delay must be taken into account covering a period from the entry of the address up to the data output. Conversely, the dynamic RAM can be advantageously used in a system such as one incorporating a high-density memory, for example, that incorporates a minimum of 16K byte memory. Any dynamic RAM stores its bit data in the bit-cell capacitor as charge. A typical construction of the dynamic RAM is shown in FIG. 1 of the attached drawings. During the write mode, any desired data is fed to the input of the dynamic RAM so that switch S1 is closed. Capacitor C is either charged or discharged according to the status of the input data. During the read mode, switch S2 is closed so that the voltage in capacitor C is compared to the reference voltage Vref of comparator CP, and then according to the difference of the voltages compared, either "1" or "0" of the binary code is transmitted to the output of the dynamic RAM. When the dynamic RAM remains in the data-hold mode, all the switches S1, S2, and S3 remain open so that the data can remain in capacitor C. Nevertheless, since the MOS capacitor is characteristically subject to leakage resistance R, the capacitor charge will be gradually discharged. To compensate for this, a process called "refreshing" must be applied to any dynamic RAM being used. To achieve this, the dynamic RAM controller must be subjected to the "refreshing" process at intervals of every 2 microseconds so that the data stored in the bit-cell can properly be held unaffected.

Conventionally, in regard to the refreshing process applied to the dynamic RAM, a variety of means are made available, for example, "burst mode refreshing process" capable of refreshing all lines within a specific period of time, for example: within 2 microseconds, and the other one called "cycle steal refreshing process" (or called "single cycle refreshing process") capable of sequentially refreshing every line at specific intervals. Of these, the "burst mode refreshing process" can be executed by means of a relatively simple circuitry. However, since this process requires entire operation of the CPU (central processing unit) to periodically halt for a relatively long period, for example, at least for a period of 50–60 microseconds for each cycle, and as a result, using this process, any real-time high-speed devices such as a floppy disc driver system cannot be accessed. Conversely, since the "cycle steal refreshing process" uses the surplus time of the CPU bus cycle, this process is advantageous because it does not cause the CPU to actually decrease the speed needed to execute any operation. On the other hand, this second process still has a difficult problem in that a considerably high speed is needed to properly operate the circuits, and the operation timing cannot easily be controlled. Of these two refreshing processes, in reference to the attached drawings, some of the existing problems related to the "burst mode refreshing process" are described below.

A simplified block diagram shown in FIG. 2 and its flowchart shown in FIG. 3 respectively denote a significant disadvantage of the conventional "burst mode refreshing process". The data contents of a dynamic RAM (DRAM) loaded in the CPU, of a microprocessor are continuously transmitted to the floppy disc controller (FDC). If the time at which the data contents were loaded from the DRAM to the CPU exactly coincides with the period when the DRAM is being refreshed by the "burst mode refreshing process", the CPU will be obliged to remain in a stand-by mode for a long time, and as a result, the contents of the dynamic RAM loaded into the CPU cannot be written into the floppy disc controller (FDC) within a pre determined period. In FIGS. 2 and 3, symbol DRAM represents a dynamic RAM, symbol FDC represents a floppy disc controller, symbol FDD represents a floppy disc device, and symbol CPU represents the central processing unit. Symbol DRQ is a data request signal output from the FDC to the CPU, while symbols $\overline{RD}$ and $\overline{WT}$ respectively represent the read and write signals output from the CPU to the FDC.

In reference to the flowchart of the CPU operation shown in FIG. 3, operations of the circuit shown in the block diagram are described below. During step S1, if the floppy disc controller (FDC) outputs a data request signal (DRQ=High) to the CPU, the mode then proceeds to step S2 where the contents of the address designated dynamic RAM (DRAM) are loaded into the CPU. After being temporarily stored in the CPU, said contents are then sent to the floppy disc controller (FDC) during the next step S3. This operation is continuously executed until all the contents of the dynamic RAM (DRAM) loaded in the CPU are completely transmitted to the floppy disc controller (FDC) during the next step S4. In this case, such a floppy disc controller can consist of a microprocessor. If any of the single side floppy discs is used as the floppy disc controller (FDC), all the data contained in the dynamic RAM (DRAM) must be fed to the floppy disc controller within 32 microseconds from the time the data request signal (DRQ) is received. This corresponds to the processing period covering steps S1 through S3 shown in the block diagram of FIG. 2. These processes are actually executed within about 30 microseconds. Using a programmed system like this, when transmitting the data contents of the dynamic RAM (DRAM) temporarily stored in the CPU to the floppy disc controller (FDC), a when such contents output from the dynamic RAM are being fed to the CPU, if this timing coincides with the period of the "burst mode refreshing process", the CPU will be obliged to stand by for a long time, and as a result, the necessary data stored in the CPU cannot be written into the floppy disc controller within the predetermined period of time. To prevent this, if the refreshing process is stopped, the period between refreshes of the RAM which should normally last 2 microseconds will run out, and as a result, the data contents remaining in the dynamic RAM will eventually be destroyed.

OBJECT AND SUMMARY OF THE INVENTION

The present invention primarily aims at solving the existing problems related to the conventional processes for refreshing the dynamic RAM, more particularly, it aims at providing a new method of refreshing the dynamic RAM, wherein said new method embodied by the present invention is characterized by the capability in regard to the execution of refreshing of the dynamic RAM using a relatively simple circuitry so that any of the real-time based high speed devices such as a floppy disc can effectively be accessed.

Another object of the present invention is to provide means for refreshing the dynamic RAM wherein it is characterized by a refreshing process that can be implemented without causing the time between refreshes to run out of the pre-determined range during the refreshing process and also without causing the data contents of the dynamic RAM to be destroyed even when any of the CPUs devoid of the dynamic RAM refreshing function accesses any real-time based high speed devices such as a floppy disc.

A still further object of the present invention is to use an "IN" instruction (that instructs input/output access the I/O space area)) output from the CPU in order to check the data request signal (DRQ) output from the floppy disc controller to the CPU. The dynamic RAM can be refreshed by means of said "IN" instruction (and the "OUT" instruction which is output from the CPU when the needed data is written into the floppy disc controller), while said "IN" instruction detects the existing state (DRQ=High ?) of step S1 that lasts for about several microseconds shown in the flowchart of FIG. 3. In such a manner as described above, the data contents of the dynamic RAM (DRAM) can be written into the floppy disc controller (FDC).

Other objects and features of the present invention will become obvious by way of the detailed description of the preferred embodiments of the present invention in reference to the attached drawings shown below.

DETAILED DESCRIPTION OF THE INVENTION

Figure 4:
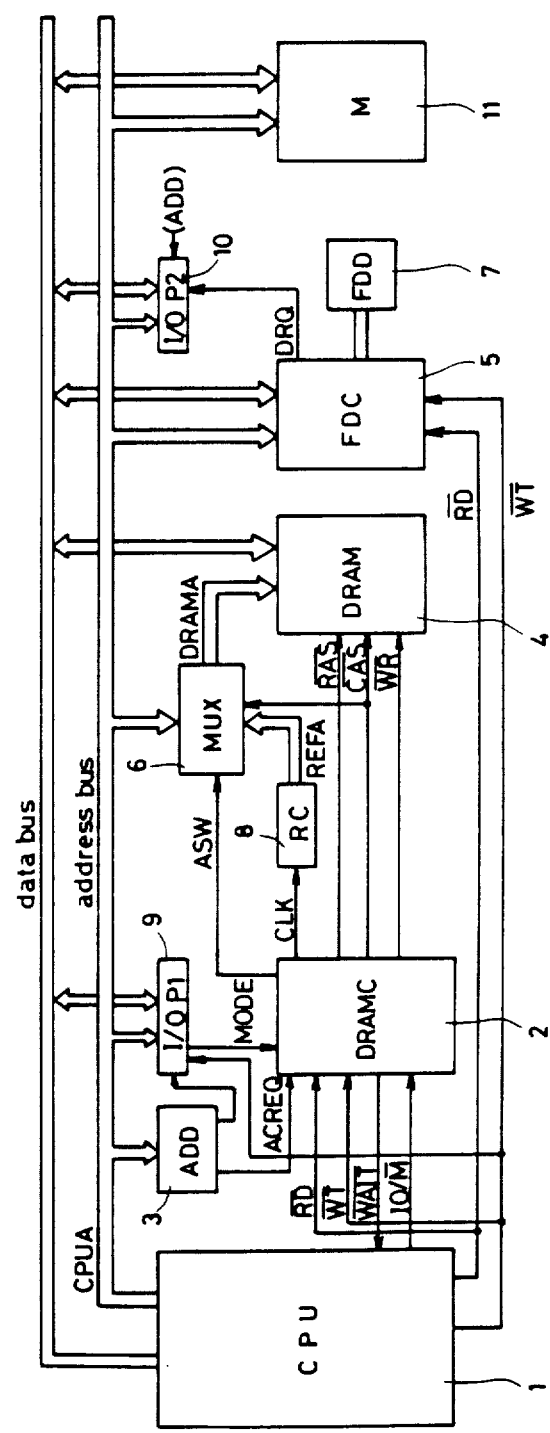
FIG. 4 shows a simplified block diagram of the circuits implementing the new method of refreshing the dynamic RAM as a preferred embodiment of the present invention.

FIG. 4 shows a simplified block diagram of the circuits implementing the new method of refreshing the dynamic RAM as a preferred embodiment of the present invention. The circuit arrangement is described below.

In the attached drawings, symbol 1 represents the CPU (central processing unit) that reads and executes a variety of instructions. Symbol 2 represents the dynamic RAM controller that controls the dynamic RAM 4 for executing the refreshing process. Symbol 3 represents the address decoder. Symbol 4 represents the dynamic RAM 4 that dynamically memorizes the incoming information. Symbol 5 represents the floppy disc controller (FDC) composed of a microprocessor that controls the floppy disc device (FDD). Symbol 6 represents the multiplexer that makes up a data transmission route. Symbol 7 represents the bit counter (for example, 7 bits) which concurrently with the refresh counter, generates a refreshing address signal (REFA) that causes the line address to advance one by one so that a desired refreshing process can be executed. Symbols 9 and 10 respectively represent the I/O ports comprising a plurality of flip flops, and symbol 11 represents another memory. Data request signal (DRQ) output from the floppy disc controller 5 sets at least a certain part of the I/O port 10. When the data request signal (DRQ) is generated by the floppy disc controller 5, the CPU 1 outputs an "IN" instruction (that instructs accessing the I/O space) to designate the contents of the I/O port 10 so that the data contents can be read into the I/O port 10 through the address bus. In other words, said IN instruction output from the CPU determines whether the data request signal (DRQ) should turn High or Low so that the process for refreshing the dynamic RAM can be executed by operating the dynamic RAM within several microseconds that corresponds to the time needed for detecting the data request signal (DRQ). Characteristics of signals needed for the refreshing process are described below.

CPUA The address bus signal output from the CPU. This signal can be commonly used for selecting the addresses of either the floppy disc controller (FDC) 5 and the other memory (M) 11, or the address of the I/O space (area).

$\overline{RD}$ This is a read signal output from the CPU.

$\overline{WT}$ This is a write signal output from the CPU.

$\overline{WAIT}$ This is a wait signal output from the dynamic RAM controller DRAMC 2 to be fed to the CPU 1. This signal causes the CPU to delay its access to the address bus.

IO/$\overline{M}$ This signal instructs which one of the I/O space (area) or memory space (area) should be selected by the CPU for accessing.

MODE This signal instructs the dynamic RAM controller DRAMC whether the existing state remains in the conventional "burst mode refreshing mode", or in the refreshing mode according to the I/O address select mode embodied by the present invention. In the present invention, the dynamic RAM refreshing process during the memory access mode is called the "burst mode refreshing", whereas the other dynamic RAM refreshing process during the I/O (such as the floppy disc driver) access mode is called the "I/O refreshing process. The MODE signal is output from I/O port 9 according to the instruction output from the CPU 1. The MODE signal is preliminarily memorized by either ROM or RAM as the program for outputting the mode select signal. Such I/O port can be composed, for example, of a plurality of flip flops. According to the preferred embodiment of the present invention, the dynamic RAM can be refreshed during either the I/O space access time where IO/$\overline{M}$ remains High, or during the I/O refreshing mode where the MODE signal remains High.

ACREQ This is an access request signal which indicates that the CPU requests the dynamic RAM to be accessed. This signal is output from the CPU through the address decoder 3. In other words, this signal is similar to the ROM chip address used by any of the conventional devices.

REFA This signal is output from the counter RC, and causes the line address to advance one by one in order to refresh the dynamic RAM DRAM 4, and so this can be applied to the dynamic RAM refreshing address.

DRAMA This signal is output from the multiplexer MUX 6, and corresponds to either the CPUA or REFA signal.

ASW This signal performs a selective switching operation to determine which one of the CPUA or REFA signal should be output.

$\overline{RAS}$ This signal selects the line addresses.

$\overline{CAS}$ This signal selects the row addresses. It selectively switches either the upper 8 bit or lower 8 bit of the CPUA address signal in the multiplexer MUX 6, and feeds the selected address signal to the dynamic RAM DRAM 4.

$\overline{WR}$ This signal used for writing any desired data into the dynamic RAM DRAM 4.

Operation

In reference to the time chart shown in FIG. 5, in particular, the operation of the dynamic RAM Controller DRAMC 2 shown in the circuit block diagram of FIG. 4 is described below.

Accessing the memory space (area)

When the address bus signal CPUA is output from the CPU 1 to the address bus line, the signal CPUA accesses the dynamic RAM 4 through multiplexer MUX 6. Simultaneously, this signal is fed to the address decoder ADD 3, and then the access request signal ACRQ output from the adress decoder ADD 3 accesses the dynamic RAM controller DRAMC 2 at the position "a". During this period, the memory space access mode exists, where IO/$\overline{M}$=Low, and so the dynamic RAM controller DRAMC 2 outputs the ASW signal, which then selectively switches either the CPUA or REFA signal, and then the ASW signal enables the dynamic RAM 4 to write or read the CPUA address bus signal in or out of itself by using either the $\overline{WT}$ or RD signal.

Figure 5:
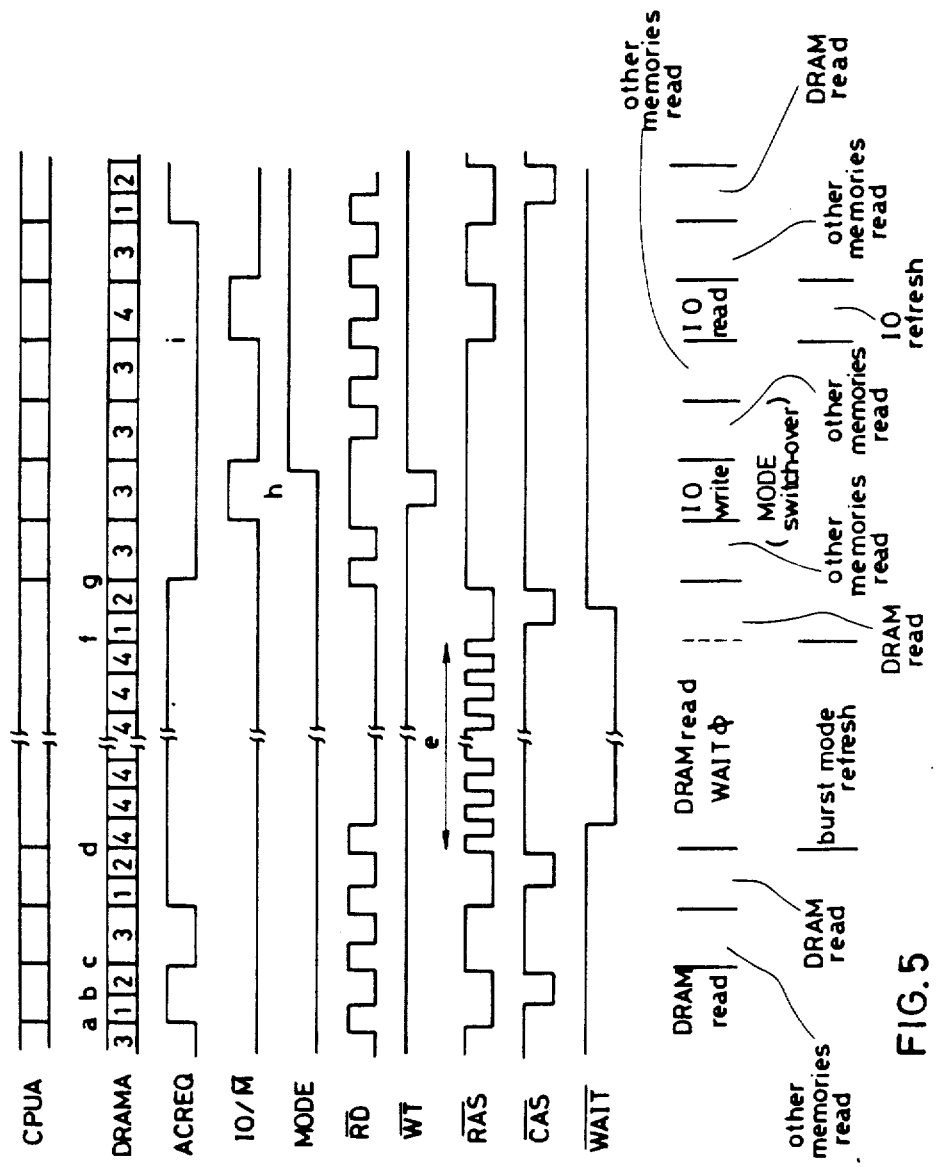
FIG 5 shows a circuit block diagram designed for refreshing the dynamic RAM shown in FIG. 4. Specifically, this is a flowchart intended for use in reference to the following detailed description with regard to the operation of said dynamic RAM.

The time chart shown in FIG. 5 represents the reading operation performed by the dynamic RAM 4. While the dynamic RAM 4 remains in the reading mode, since the row address select signal $\overline{CAS}$ remains High during the first half of the reading period, this signal cannot be output from the dynamic RAM controller DRAMC 2, and instead, the upper 8 bit (denoted as "1") of the address signal CPUA fed from the CPU 1 is input to the dynamic RAM 4 so that it executes the reading operation. During the latter half of the reading operation, the row address select signal $\overline{CAS}$ remains Low, and so this signal can be output from the dynamic RAM controller DRAMC 2 at the position "b" in order that the lower 8 bit (denoted as "2") of the address signal CPUA can be input to the dynamic RAM 4 which then executes a reading operation. Since a High $\overline{WAIT}$ signal is fed from the dynamic RAM controller DRAMC 2 to the CPU 1 during these processes, the CPU does not stop its operation at all. After a specific time is past, the CPU 1 then inactivates either the read $\overline{RD}$ or write $\overline{WT}$ signal, and as a result, the dynamic RAM controller DRAMC 2 also inactivates the $\overline{CAS}$, $\overline{RAS}$, and $\overline{WR}$ signals so that the bus cycle can be completed at the position "c". In this manner described above, the dynamic RAM 4 executes the reading operation.

On the other hand, when the CPU 1 accesses any other devices such as memory 11 or I/O ports, the access request signal ACREQ is not output from the dynamic RAM controller 4. In other words, since this signal remains Low, the dynamic RAM controller DRAMC 2 outputs neither the $\overline{CAS}$ nor $\overline{RAS}$ signal. Therefore, such an address signal as denoted by DRAMA in the dynamic RAM 4 may remain in a random sequence as shown in the digital row of the time chart, typically by the digit 3.

Burst mode refreshing process

If the CPU 1 encounters the "burst mode refreshing cycle" at the position "d" when the CPU is about to access the dynamic RAM, the dynamic RAM controller DRAMC 2 outputs a Low $\overline{WAIT}$ signal to the CPU 1 in order to delay the bus cycle until the $\overline{WAIT}$ signal is freed. In other words, the dynamic RAM controller DRAMC 2 executes a refreshing operation covering a maximum of 128 lines of the dynamic RAM 4 during the period "e", and after completing the refreshing process, the dynamic RAM controller DRAMC 2 resumes the bus cycle processes at the position "f". Simultaneously, the $\overline{WAIT}$ signal is inactivated, while the CPU 1 terminates its bus cycle at the position "g".

Accessing the I/O space (area)

Figure 1:
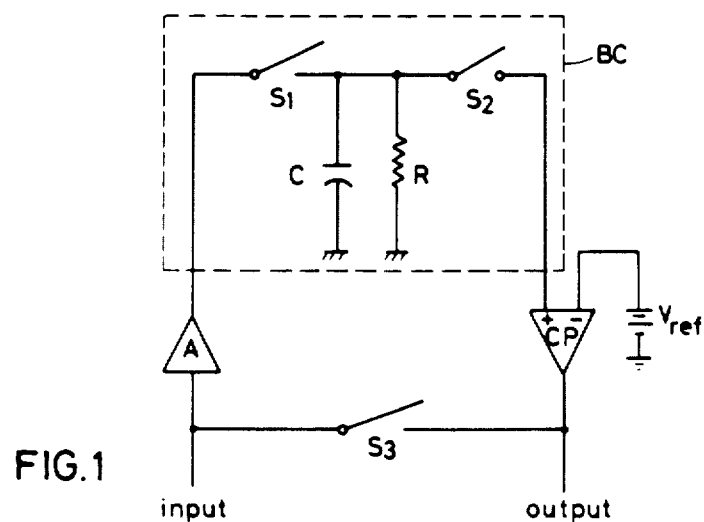
FIG. 1 shows a schematic diagram of the bit-cell of the dynamic RAM.
Figure 2:
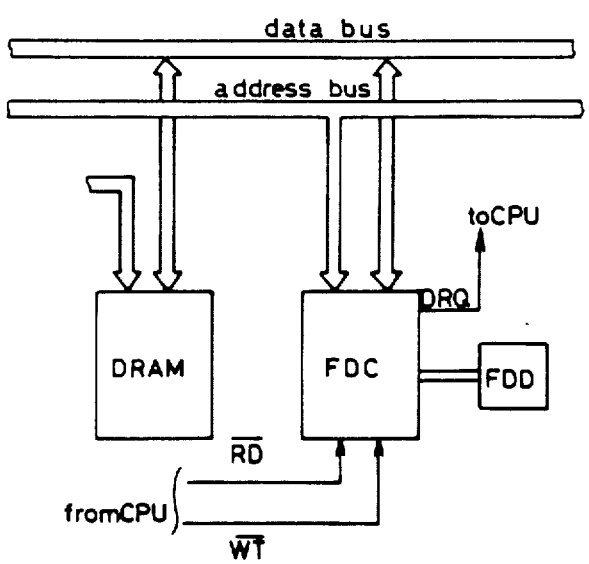
FIG. 2 shows a simplified block diagram of a circuitry describing the "burst mode refreshing process" applied to a conventional dynamic RAM.
Figure 3:
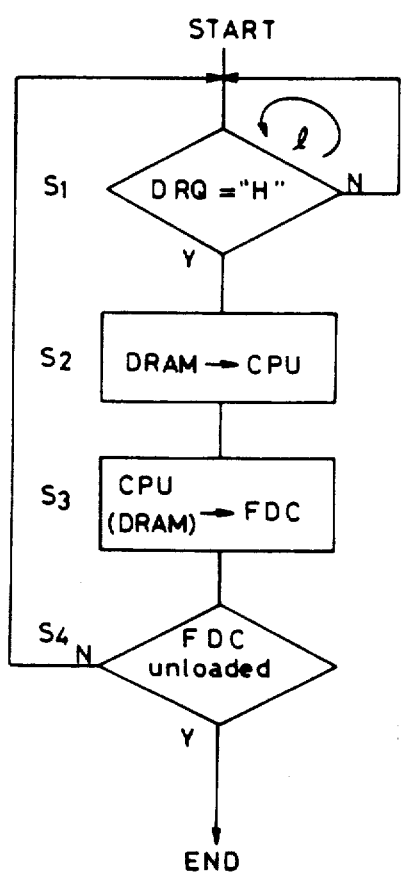
FIG. 3 shows a flowchart describing sequential operations of the circuitry shown in FIG. 2.

When the data request signal DRQ is generated by the floppy disc controller 5, part of flip flops of the I/O port 10 is set, and then the CPU 1 inputs the data contents of the I/O port 10 to itself via bus line in accordance with the "IN" instruction that instructs the access of the I/O space. The CPU 1 checks to see if the data request instruction signal DRQ is High or Low (refer to loop "l" shown in FIG. 3). After the CPU 1 designates the I/O space access mode to be IO/$\overline{M}$=High at the position "h", the I/O device space is then accessed so that the ensuing mode enables the bus cycle to execute refreshing of the dynamic RAM DRAM 4 against each line during the access period. If the I/O space is again accessed at the position "i", since the I/O refresh mode (a refreshing process during the I/O space access mode) already exists, the refreshing signal REFA output from the refreshing counter 8 is fed to the dynamic RAM 4, and the $\overline{RAS}$ is output from the dynamic RAM controller DRAMC 2.

The contents of the signal REFA output from the refreshing counter 8 correspond to the value that ensues the 128th refreshing process completed during the period "e" mentioned above. In other words, since the row address access select signal $\overline{CAS}$ cannot be output during the I/O refreshing period, the data pins of the dynamic RAM 4 remain open, and as a result, the refresh signal REFA will not encounter with any of such data routed to the CPU data bus. FIG. 5 represents rows where the I/O refreshing process has been applied to only one line. During this operation, after the I/O space is read, the I/O refreshing process is applied to only one line, then the data contents are read out from another memory, and finally the data contents are read out from the dynamic RAM DRAM 4.

The CPU 1 needs only a maximum of several microseconds to implement a loop operation (refer to loop " " shown in FIG. 3) for checking the data request signal (DRQ). To check this signal, the CPU executes the "IN" instruction, i.e., an instruction given to the CPU in order to access the I/O space (area). Conversely, if a refreshing process is applied to the dynamic RAM 4 in accordance with the execution of either the "IN" or "OUT" instruction needed for writing any specific data into the floppy disc controller 5, the data contents stored in the dynamic RAM 4 can eventually be safeguarded from destruction.

The preferred embodiment of the present invention described above shows that the wait signal $\overline{WAIT}$ remains activated (High) during the period "e". During this period, if the CPU 1 uses another memory without accessing the dynamic RAM 4, then the $\overline{WAIT}$ signal cannot be generated, and as a result, the CPU can selectively switch refreshing modes even when the mode remains in the period "e". If this mode is entered, the dynamic RAM controller DRAMC 2 can discontinue the "burst mode refreshing process" and simultaneously enters the I/O refreshing mode. As described above, according to the method of refreshing the dynamic RAM embodied by the present invention, when accessing any of the real-time high-speed devices such as the floppy disc driver unit, such a refreshing process can be smoothly executed by using relatively simple circuit means without causing the time to run out of the effective life of the needed data, and yet, without destroying the data contained in the dynamic RAM at all.

The present invention thus described in reference to the annexed drawings will obviously be suggestive of any derivation or modification from the spirit and scope described therein by those skilled in the arts. However, it should be understood that the present invention is not limitative within the spirit and scope described above, but is intended to solely include all of such derivations and/or modifications within the spirit and scope of the following claims.

What is claimed is:

1. Means for refreshing a dynamic RAM in a computer system having a central processor, a dynamic RAM accessible by said central processor and having a plurality of memory elements, and at least one input-output port comprising:
    burst mode refresh means for refreshing all said memory elements of said dynamic RAM, said dynamic RAM not being accessible by said central processor when refreshing is performed by said burst mode refresh means;
    means for determining if said input-output port is being accessed by said central processor and for developing an input/output access mode signal representative thereof;
    input/output refresh means, responsive to said means for determining, for refreshing only a portion of said memory elements upon detection of said input/output access mode signal; and
    means for enabling said burst mode refresh means to refresh all said memory elements of said dynamic RAM only when said dynamic RAM has not been refreshed for a predetermined period of time.

2. The means of claim 1 wherein said memory elements are arranged in a plurality of memory lines, said dynamic RAM being refreshed in a line by line fashion by said input/output refresh means when said input/output access mode signal is developed by said means for determining.

3. The means of claim 1 further comprising:
    read/write access means for accessing said dynamic RAM to read and write information therefrom;
    said means for enabling said burst mode refresh means further inhibiting said read/write access means.

4. A method of refreshing a dynamic RAM in a computer system having a central processor, a dynamic RAM accessible by said central processor and having a plurality of memory elements arranged in line, and at least one input-output port comprising:
    determining if said input-output port is being accessed by said central processor and developing an input/output access mode signal in response thereto;
    refreshing said memory elements, line by line upon detection of said input/output access mode signal;
    refreshing all of said memory elements by burst refreshing only if said dynamic RAM has not been refreshed for a predetermined period of time.

* * * * *